(12) United States Patent
Sun et al.

(10) Patent No.: US 6,828,196 B2
(45) Date of Patent: Dec. 7, 2004

(54) TRENCH FILLING PROCESS FOR PREVENTING FORMATION OF VOIDS IN TRENCH

(75) Inventors: Pei-Feng Sun, Hsinchu (TW); Shih-Chi Lai, Hsinchu (TW); Mao-Song Tseng, Hsinchu (TW); Yi-Fu Chung, Hsinchu (TW)

(73) Assignee: Mosel Vitelec, Inc., Hsinchu (TW)

( * ) Notice: Subject to any disclaimer, the term of this patent is extended or adjusted under 35 U.S.C. 154(b) by 0 days.

(21) Appl. No.: 10/652,635

(22) Filed: Aug. 28, 2003

(65) Prior Publication Data

US 2004/0166635 A1 Aug. 26, 2004

(30) Foreign Application Priority Data

Feb. 26, 2003 (TW) ........................................ 92103955 A

(51) Int. Cl.[7] ............................................. H01L 21/336
(52) U.S. Cl. ...................... 438/270; 438/386; 438/748; 257/301
(58) Field of Search ............................. 438/199, 200, 438/230, 239, 243, 245, 270, 386–388, 444–446, 696–697, 700, 704, 706, 745, 748, 754; 257/204, 277, 301, 516, 532

(56) References Cited

U.S. PATENT DOCUMENTS 5,244,843 A * 9/1993 Chau et al. .................. 438/452
2003/0064598 A1 * 4/2003 Chung et al. ................ 438/694
2003/0216044 A1 * 11/2003 Lin et al. ..................... 438/689
2004/0082200 A1 * 4/2004 Lin et al. ..................... 438/791

* cited by examiner

Primary Examiner—Kamand Cuneo
Assistant Examiner—Lisa Kilday
(74) Attorney, Agent, or Firm—Townsend and Townsend and Crew LLP

(57) ABSTRACT

Embodiments of the present invention relate to a process for filling a trench structure of a semiconductor device to prevent formation of voids in the trench structure so as to minimize current leakage and provide excellent electrical properties. In one embodiment, a process for filling a trench of a semiconductor device comprises providing a semiconductor substrate; forming a silicon nitride layer on the semiconductor substrate; forming an oxide layer on the silicon nitride layer; partially removing the oxide layer, the silicon nitride layer and the semiconductor substrate to form at least one trench; forming a sacrificial oxide layer on sidewalls of the trench; removing the sacrificial oxide layer; performing an etching procedure to remove portions of the silicon nitride layer protruding from the sidewalls of the trench so as to form substantially even sidewalls of the trench; and forming a trench-fill layer to fill the trench and deposit on the oxide layer.

22 Claims, 5 Drawing Sheets

TRENCH FILLING PROCESS FOR PREVENTING FORMATION OF VOIDS IN TRENCH

CROSS-REFERENCES TO RELATED APPLICATIONS

This application claims priority from R.O.C. patent application Ser. No. 092103955, filed Feb. 26, 2003, the entire disclosure of which is incorporated herein by reference.

BACKGROUND OF THE INVENTION

The present invention relates to a trench filling process for preventing formation of voids, and more particularly to a process for filling a trench structure of a trench-type MOS device so as to prevent formation of voids in the trench structure.

Nowadays, trench-type MOS devices are widely used in the semiconductor industry. A process for producing a trench-type PMOS device is illustrated with reference to FIGS. 1(a) to 1(d).

In FIG. 1(a), a pad oxide layer 11, a silicon nitride layer 12 and an oxide layer 13 are sequentially formed on a semiconductor substrate 10. The pad oxide layer 11 functions as a buffer layer so as to reduce stress between the semiconductor substrate 10 and the silicon nitride layer 12. The silicon nitride layer 12 is deposited on the pad oxide layer 11 at a temperature of about 400° C. to 800° C. by using reactive gases comprising $SiH_4$, $N_2O$ and $NH_3$. The oxide layer 13 is formed on the silicon nitride layer 12 by using a chemical vapor deposition (CVD) procedure.

Then, the oxide layer 13, the silicon nitride layer 12, the pad oxide layer 11 and the semiconductor substrate 10 are partially etched to form a trench structure 14 by a micro-photolithography and dry-etching procedure, as can be seen in FIG. 1(b). Preferably, the dry-etching procedure is performed by a plasma-etching system.

As is known in the art, after the plasma-etching procedure is performed, some particles might be produced on the bottom and/or sidewalls of the trench structure 14 and thus uneven surfaces are formed thereon. In order to overcome such a problem, a sacrificial oxide layer (not shown) is formed on the sidewall of the trench structure 14, and then approximately 500 Å of the sacrificial oxide layer is removed so as to form a resulting structure of FIG. 1(c).

A trench-fill layer 15 such as a polysilicon layer is then formed to fill the trench structure 14 and deposited over the oxide layer 13, and a drive-in procedure is performed at a temperature of 800~1000° C., thereby forming a resulting trench structure of FIG. 1(d).

After the step of removing the sacrificial oxide layer, it is often unavoidable to remove partial side surfaces of the pad oxide layer 11 and sidewalls of the semiconductor 10 to approximately 200 Å. The silicon nitride layer 12 will protrude from the sidewalls of the trench structure 14 so as to form a salient 120 (as shown in FIG. 1(c). Referring again to FIG. 1(d), after the polysilicon layer 15 is filled in the trench structure 14 and the drive-in procedure is performed, some undesirable voids 151 will typically be formed in the vicinity under the salient 120 or even in other parts of the trench structure 14. When the finished semiconductor device is operated, current leakage usually occurs due to the formation of voids and undercutting from dry-etching procedure.

Therefore, there is a need for a process for preventing formation of voids in the trench structure upon filling a trench-fill layer such as a polysilicon layer so as to overcome the above-mentioned problems.

BRIEF SUMMARY OF THE INVENTION

Embodiments of the present invention relate to a process for filling a trench structure of a semiconductor device to prevent formation of voids in the trench structure so as to minimize current leakage and provide excellent electrical properties.

In accordance with an aspect of the present invention, a process for filling a trench of a semiconductor device comprises providing a semiconductor substrate; forming a silicon nitride layer on the semiconductor substrate; forming an oxide layer on the silicon nitride layer; partially removing the oxide layer, the silicon nitride layer and the semiconductor substrate to form at least one trench; forming a sacrificial oxide layer on sidewalls of the trench; removing the sacrificial oxide layer; performing an etching procedure to remove portions of the silicon nitride layer protruding from the sidewalls of the trench so as to form substantially even sidewalls of the trench; and forming a trench-fill layer to fill the trench and deposit on the oxide layer.

In some embodiments, the etching procedure is a wet-etching procedure. The wet-etching procedure is performed for about 100 to 200 seconds. The wet-etching procedure is performed by an etchant with a selectivity of silicon nitride layer to oxide layer of at least about 10. The etchant desirably has a selectivity of silicon nitride layer to oxide layer ranging from about 50 to 100. The etchant comprises a phosphoric acid solution. The wet-etching procedure is performed at a temperature of about 130° C. to 180° C. A pad oxide layer is formed between the semiconductor substrate and the silicon nitride layer before forming the silicon nitride layer. An ion drive-in procedure is performed after forming the trench-fill layer to fill the trench and deposit on the oxide layer. The ion drive-in procedure is performed at a temperature of about 800° C. to 1,000° C.

In accordance with another aspect of the present invention, a process for producing a trench-type semiconductor device comprises providing a semiconductor device including an oxide layer disposed on a silicon nitride layer which is disposed on a semiconductor substrate, and a trench extending through the oxide layer and the silicon nitride layer and partially through the semiconductor substrate, the silicon nitride layer protruding from sidewalls of the trench. The method further comprises an etching procedure having a higher selectivity for the silicon nitride layer than for the oxide layer sufficient to remove portions of the silicon nitride layer protruding from the sidewalls of the trench to form substantially even sidewalls of the trench. A trench-fill layer is formed to fill the trench and deposit on the oxide layer. The trench-type semiconductor device may comprise a PMOS.

DETAILED DESCRIPTION OF THE INVENTION

Embodiments of the present invention relate to a process for preventing formation of voids in a trench structure of a trench-type MOS device upon filling a polysilicon layer so as to minimize current leakage and provide excellent electrical properties. A process according to an exemplary embodiment of the present invention for producing a trench-type PMOS device is illustrated with reference to FIGS. 2(a) to 2(e).

Figure 1A:
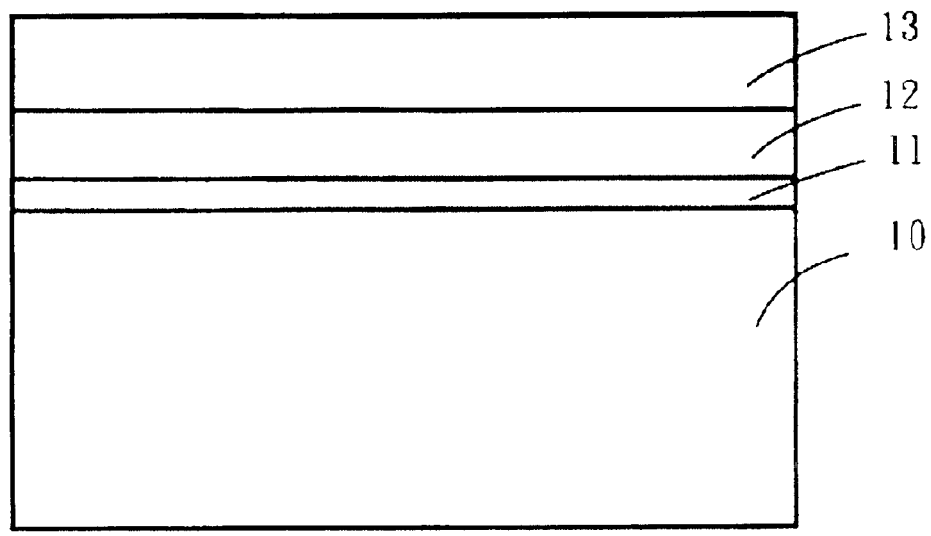
FIGS. 1(a) to 1(d) are schematic cross-sectional views illustrating a conventional process for producing a trench-type PMOS device.
Figure 1B:
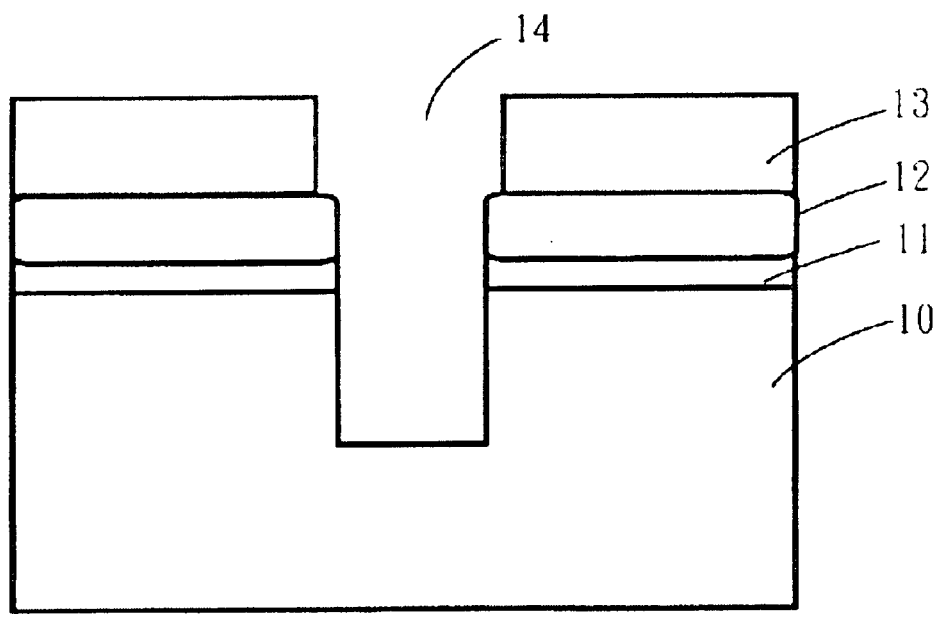
Figure 1C:
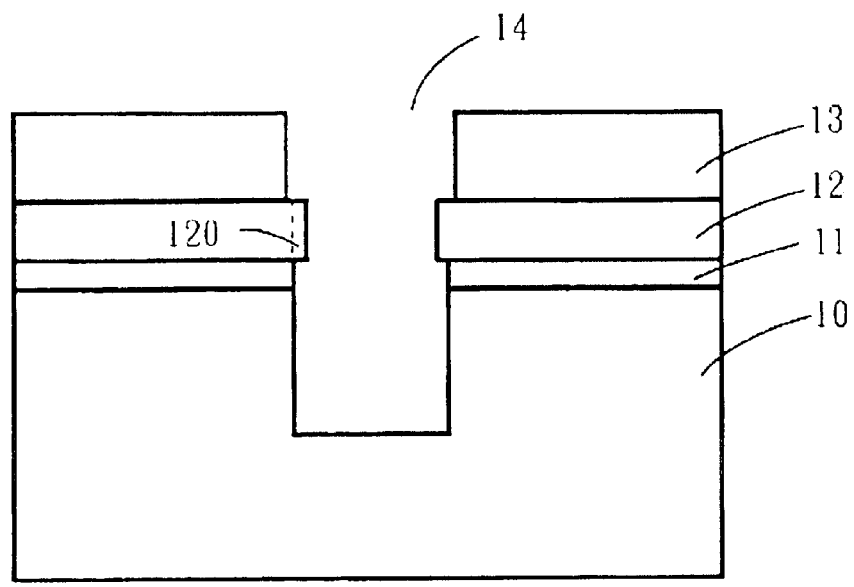
Figure 1D:
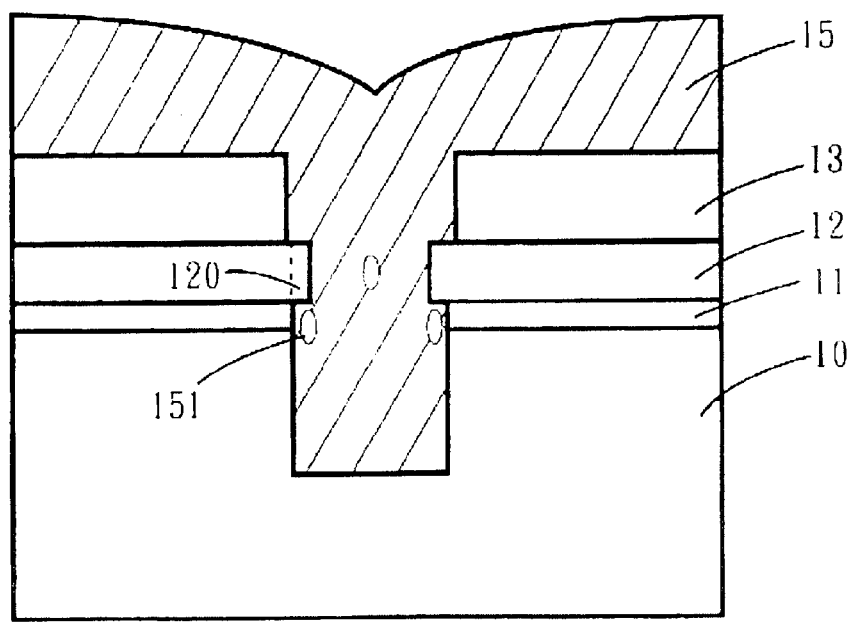
Figure 2A:
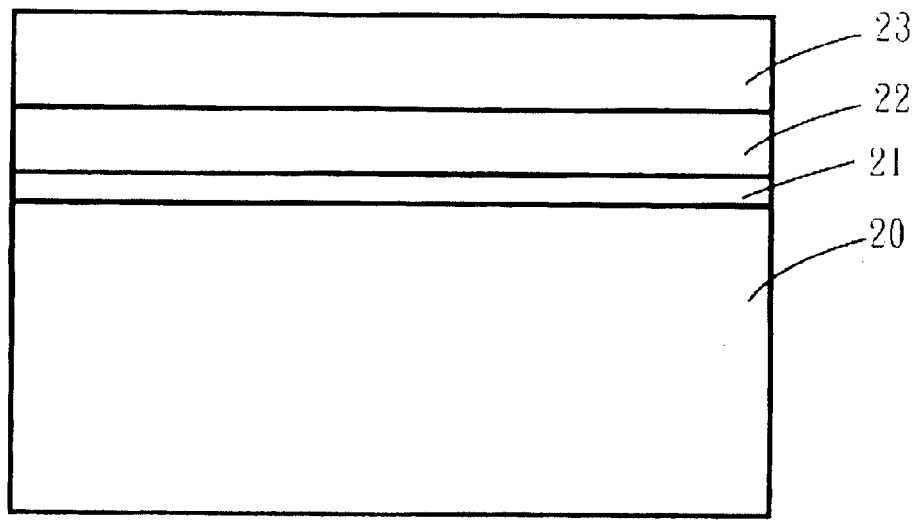
FIGS. 2(a) to 2(e) are schematic cross-sectional views illustrating a process for producing a trench-type PMOS device according an exemplary embodiment of the present invention.

In FIG. 2(a), a pad oxide layer 21, a silicon nitride layer 22 and an oxide layer 23 are sequentially formed on a semiconductor substrate 20. The semiconductor substrate 20 can be made of silicon. The pad oxide layer 21 functions as a buffer layer so as to reduce stress between the semiconductor substrate 20 and the silicon nitride layer 22. The oxide layer 23 is typically made of silicon dioxide.

Figure 2B:
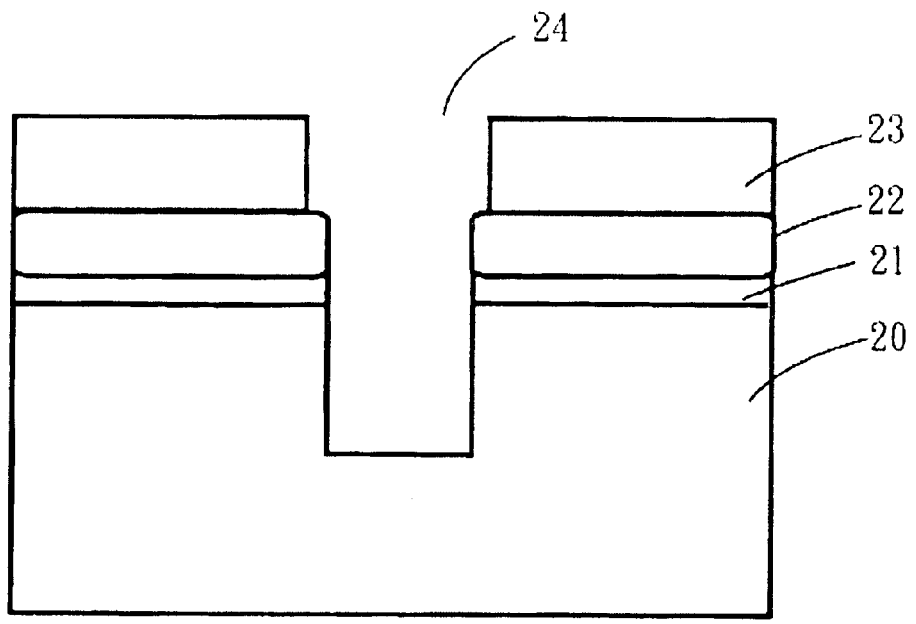

Then, the oxide layer 23, the silicon nitride layer 22, the pad oxide layer 21 and the semiconductor substrate 20 are partially etched to form at least one trench structure 24 by a micro-photolithography and dry-etching procedure, as can be seen in FIG. 2(b). In one example, the trench structure 24 may have a depth of about 1.5 to 2.5 $\mu$m and a width of about 0.5 $\mu$m.

Figure 2C:
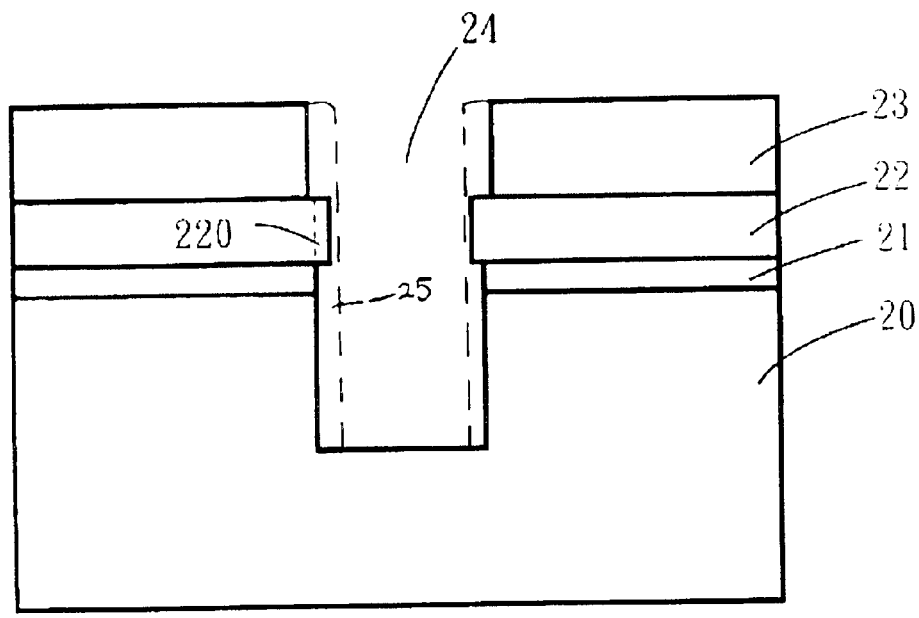

As also is known in the art, after the plasma-etching procedure is performed, some particles might be produced on the bottom and/or sidewalls of the trench structure 24 and thus uneven surfaces are formed thereon. In order to overcome such a problem, a sacrificial oxide layer 25 is formed on the sidewalls of the trench structure 24, and then the sacrificial oxide layer is removed to approximately 500 Å. After the step of removing the sacrificial oxide layer, it is often unavoidable to remove partial side surfaces of the pad oxide layer 21 and sidewalls of the semiconductor 20 to approximately 200 Å. The silicon nitride layer 22 will protrude from the sidewalls of the trench structure 24 so as to form a salient 220 (as shown in FIG. 2(c)).

Figure 2D:
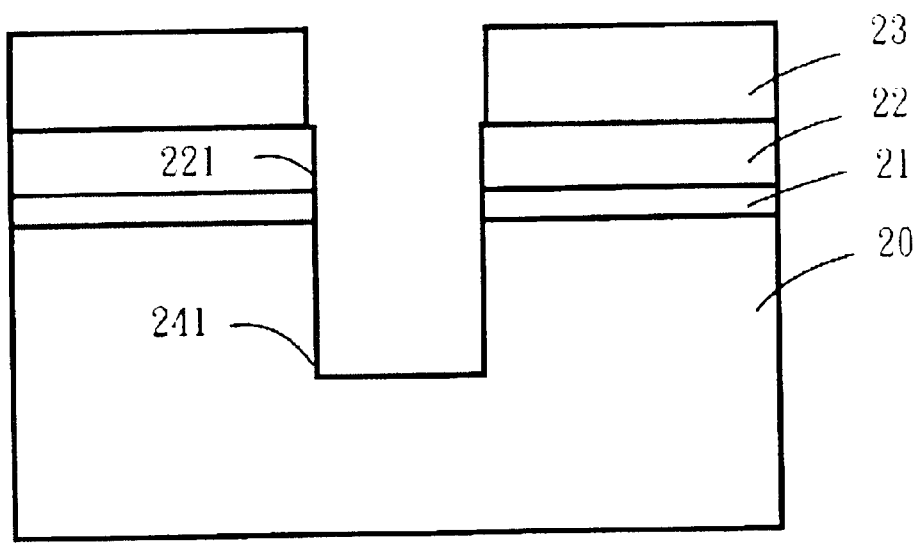

In order to remove the salient 220, as shown in FIG. 2(d), a pull back etch procedure is performed by contacting the trench structure 24 with an etchant. The etchant is chosen such that the selectivity of the silicon nitride layer to the oxide layer is at least about 10, and preferably ranges from about 50 to 100. As a result, the salient 220 is effectively etched with minimum loss of the oxide layer. In a specific embodiment, the etchant is a phosphoric acid ($H_3PO_4$) solution, and the back etch procedure is carried out at a temperature of about 130° C. to 180° C., and preferably about 150° C. to 170° C. Depending on the type of etchant, the contacting time is varied. For example, when a hot phosphoric acid solution is employed as an etchant, the contacting time ranges from about 50 to 600 seconds, and preferably from about 100 to 200 seconds. After the pull back etch procedure is completed, the salient 220 will be removed and thus the side surfaces 221 of the silicon nitride layer 22 are substantially continuous with the sidewalls 241 of the trench structure 24.

Figure 2E:
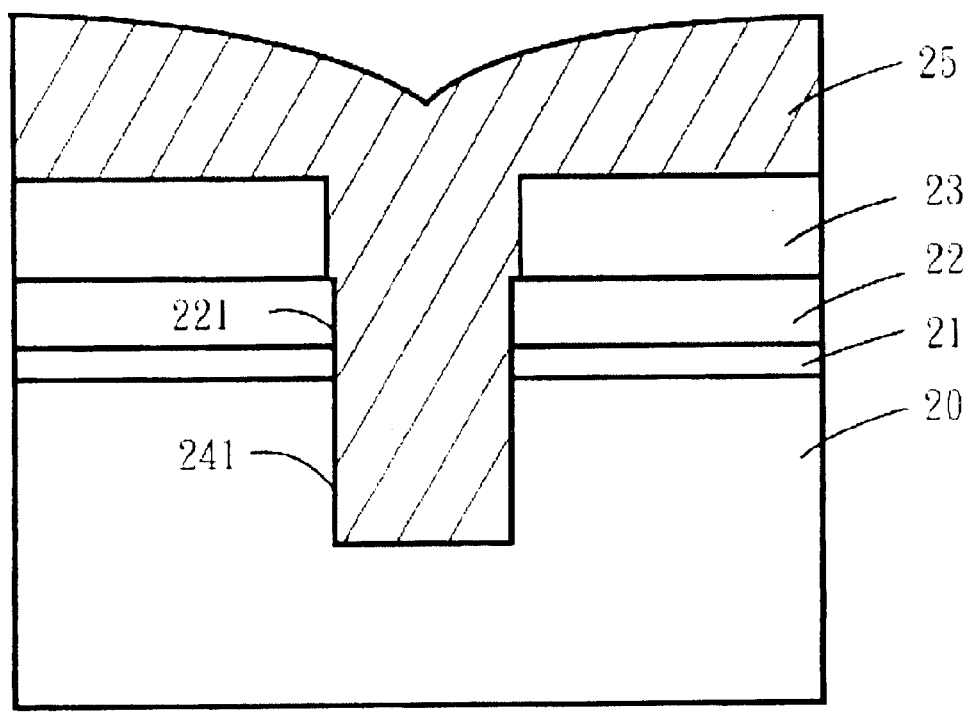

A polysilicon layer 25 is then deposited over the oxide layer 23 and filled in the trench structure 24, and a drive-in procedure is performed at a temperature of about 800~1000° C. to introduce a P-type dopant, thereby forming a resulting trench structure of FIG. 2(e). Since the salient 220 shown in FIG. 2(d) is virtually removed, no voids or at least substantially fewer voids are observed in the polysilicon layer 25 of the resulting structure. Then, subsequent procedures are performed (not shown) so as to finish the trench-type PMOS device.

As will be apparent from the above description according to the present invention, the silicon nitride salient resulted from the step of removing the sacrificial oxide layer will be effectively removed by using the pull back etch procedure of the present invention. The undercutting effect occurred in the prior art will be exempted due to the even sidewalls of the trench structure. Furthermore, no voids are observed after the polysilicon layer is filled and the drive-in procedure is done so as to minimize current leakage and provide excellent electrical properties of the PMOS device.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A process for filling a trench of a semiconductor device, the method comprising:

providing a semiconductor substrate;

forming a silicon nitride layer on said semiconductor substrate;

forming an oxide layer on said silicon nitride layer;

partially removing said oxide layer, said silicon nitride layer and said semiconductor substrate to form at least one trench;

forming a sacrificial oxide layer on sidewalls of said trench;

removing said sacrificial oxide layer;

performing an etching procedure to remove portions of said silicon nitride layer protruding from said sidewalls of said trench so as to form substantially even sidewalls of said trench; and forming a trench-fill layer to fill said trench and deposit on said oxide layer.

2. The process according to claim 1 wherein said etching procedure is a wet-etching procedure.

3. The process according to claim 2 wherein said wet-etching procedure is performed for about 100 to 200 seconds.

4. The process according to claim 2 wherein said wet-etching procedure is performed by an etchant with a selectivity of silicon nitride layer to oxide layer of at least about 10.

5. The process according to claim 4 wherein said etchant has a selectivity of silicon nitride layer to oxide layer ranging from about 50 to 100.

6. The process according to claim 5 wherein said etchant comprises a phosphoric acid solution.

7. The process according to claim 2 wherein said wet-etching procedure is performed at a temperature of about 130° C. to 180° C.

8. The process according to claim 1 further comprising forming a pad oxide layer between said semiconductor substrate and said silicon nitride layer before forming said silicon nitride layer.

9. The process according to claim 1 further comprising an ion drive-in procedure after forming said trench-fill layer to fill said trench and deposit on said oxide layer.

10. The process according to claim 9 wherein said ion drive-in procedure is performed at a temperature of about 800° C. to 1,000° C.

11. A process for producing a trench-type semiconductor device, the process comprising:

providing a semiconductor device including an oxide layer disposed on a silicon nitride layer which is disposed on a semiconductor substrate, and a trench extending through said oxide layer and said silicon nitride layer and partially through said semiconductor substrate, said silicon nitride layer protruding from sidewalls of said trench;

performing an etching procedure having a higher selectivity for said silicon nitride layer than for said oxide layer sufficient to remove portions of said silicon nitride layer protruding from said sidewalls of said trench to form substantially even sidewalls of said trench; and forming a trench-fill layer to fill said trench and deposit on said oxide layer.

12. The process according to claim 11 wherein said etching procedure is a wet-etching procedure.

13. The process according to claim 12 wherein said wet-etching procedure is performed by an etchant with a selectivity of silicon nitride layer to oxide layer of at least about 10.

14. The process according to claim 13 wherein said etchant has a selectivity of silicon nitride layer to oxide layer ranging from about 50 to 100.

15. The process according to claim 12 wherein said wet-etching procedure is performed for about 100 to 200 seconds.

16. The process according to claim 12 wherein said etchant comprises a phosphoric acid solution.

17. The process according to claim 12 wherein said wet-etching procedure is performed at a temperature of about 130° C. to 180° C.

18. The process according to claim 11 wherein said semiconductor device further comprises a pad oxide layer between said semiconductor substrate and said silicon nitride layer.

19. The process according to claim 11 further comprising an ion drive-in procedure after forming said trench-fill layer to fill said trench and deposit on said oxide layer.

20. The process according to claim 19 wherein said ion drive-in procedure is performed at a temperature of about 800° C. to 1,000° C.

21. The process according to claim 11 wherein said trench-type semiconductor device comprises a PMOS.

22. The process according to claim 11 wherein said trench-fill layer comprises polysilicon.

* * * * *